United States Patent [19]

Collins et al.

[11] 4,386,417
[45] May 31, 1983

[54] HIGH PERFORMANCE BUBBLE CHIP ARCHITECTURE

[75] Inventors: Thomas W. Collins, Saratoga; Michael G. Hurley, Cupertino, both of Calif.

[73] Assignee: International Business Machines Corporation, Armonk, N.Y.

[21] Appl. No.: 280,024

[22] Filed: Jun. 30, 1981

[51] Int. Cl.³ .............................................. G11C 19/08
[52] U.S. Cl. ........................................ 365/12; 365/15
[58] Field of Search ......................... 365/1, 12, 15, 16

[56] References Cited

U.S. PATENT DOCUMENTS

| | | | |
|---|---|---|---|
| 3,618,054 | 11/1971 | Bonyhard | 365/15 |
| 3,838,407 | 9/1974 | Julliussen | 365/15 |
| 3,999,172 | 12/1976 | Bhandarkar | 365/12 |
| 4,081,861 | 3/1978 | Linn | 365/12 |
| 4,090,251 | 5/1978 | Flannigan et al. | 365/15 |
| 4,125,875 | 11/1978 | Saito | 365/12 |

Primary Examiner—James W. Moffitt
Attorney, Agent, or Firm—Joseph E. Kieninger

[57] ABSTRACT

A major/minor loop bubble memory system architecture includes a passive replicator in the major loop read channel which is connected by a first path to a mode switch-annihilator and a merge point in the major loop write channel and by a second path to an off-chip decision-making means and the merge point in the write channel. The decision-making means is positioned the same or fewer propagation steps than the mode switch-annihilator is from the replicator. The decision making means is activated to cause either the replicated data to pass through the mode switch-annihilator into the write channel or the replicated data to be annihilated in the mode switch-annihilator and the data from a generator to pass into the write channel.

6 Claims, 4 Drawing Figures

HIGH PERFORMANCE BUBBLE CHIP ARCHITECTURE

TECHNICAL FIELD

This invention relates to a major/minor loop bubble memory chip architecture and more particularly to an architecture that provides improved data writing and storage capability.

BACKGROUND ART

Several different major/minor loops memory organizations or architectures are described in U.S. Pat. Nos. 3,618,054; 3,838,407 and 3,999,172. Typically, both the major loop and the minor loop are established by an arrangement of chevron or C-bar permalloy type circuits on a film of a magnetic garnet material. The bubble domains or bubbles are moved around the loop by a magnetic field which rotates in the plane of the magnetic material. The major loop is generally elongated such as to allow a number of minor loops to be aligned along the side. The major loop may be closed as shown in U.S. Pat. No. 3,618,054. With a closed major loop, two-way transfer gates permit the transfer of bubbles from the minor loops to the major loop and from the major loop to the minor loops.

Major loops may also be of the open type disclosed in U.S. Pat. Nos. 3,838,407 and 3,999,172 as is shown in FIG. 1. With the open type of major loop, one-way transfer gates from the write channel 10 of the major loop transfer bubbles into one side 12 of the minor loops and another transfer gate permits bubbles to be transferred out of the other end 14 of the minor loops into the read channel 16 of the major loop. Data information stored in the minor loop is circulated until the desired block of data consisting of one bit from each loop reaches the transfer points. On command of a read transfer signal from the decision-making means or control center 18, the information is transferred to the reach channel of the major loop whereupon it is read by a detector 20. The detected information, or alternatively new information is used to control the generation of bubbles at generator 22 which are subsequently propagated along the write channel of the major loop to the write transfer switches. On command of a write transfer signal from control center 18, the information is transferred from the write channel 10 into the minor loops 12. This organization has the following disadvantages. Any arbitrarily referenced bit or byte cannot be positioned at the detector for future reading without using the off chip signal path or without losing information that preceeds the bit or byte. Upon reading a stream of information that ends on an arbitrary bit or byte, the information that follows must either be passed through the off chip signal path or lost. Another disadvantage is that the use of the off chip signal path prior to and after a stream of information degrades the performance, i.e. throughput, of a multimodule bubble store. A further disadvantage is that the information that is read from the chip, passed through the signal path and then returned to the chip is exposed to data loss when it is in the signal path.

Another open major loop type architecture was described by Bonyhard in 1978 at the Indian Wells 3M Annual Meeting and is shown in FIG. 2. This organization has a replicator/annihilator 24 with one path going to the detector 20. Another path 26 goes from the replicator 24 to the generator/merge point 22 that is in the write channel 10. In this organization, a merge point 28 connects the read channel 16 and the write channel 10. With the system shown in FIG. 2, one needs to make a decision before he reads the data whether the data is to be annihilated at the replicator or not. Hence, this has the disadvantages of lack of flexibility. One cannot read information from the bubble chip and then on the basis of this information make a decision to restore it unchanged, change it or replace it on the chip.

In addition, one cannot read information from the bubble chip and then on the basis of this information make a decision to change or leave unchanged the bits or bytes that immediately follow the information read.

SUMMARY OF THE INVENTION

A major/minor loop bubble memory system architecture includes a passive replicator in the major loop read channel which is connected by a first path to a mode switch-annihilator and a merge point in the write loop and by a second path to an off chip decision-making means and the merge point in the major loop write channel. The decision-making means is positioned the same or fewer propagation steps than the mode switch-annihilator is from the replicator. The decision-making means is activated to cause either the replicated data to pass through the mode switch-annihilator into the write channel or the replicated data to be annihilated in the mode switch-annihilator and the data from a generator to pass into the write channel. This architecture allows a number of functions to be performed. One function is that any bit or byte can be positioned within the module to the detector for future reading or writing without the use of an off chip data path and without the loss of data stored on the chip. Another function is that this system permits the reading of a variable length group of bits from the chip before a decision is made to write or leave unchanged the bits that follow or the bits that already have been read. A third function is that following a read or a write of a variable length of bits, the propagation of these and any adjacent bits from the read channel and replicate path into the write channel and minor loops can be done without the use of an off chip path.

For a further understanding of the invention, and of the advantages thereof, reference will be had to the following description and accompanying drawings, and to the appended claims, in which the various novel features of the invention are more particularly set forth.

DESCRIPTION OF THE PREFERRED EMBODIMENT

Figure 1:
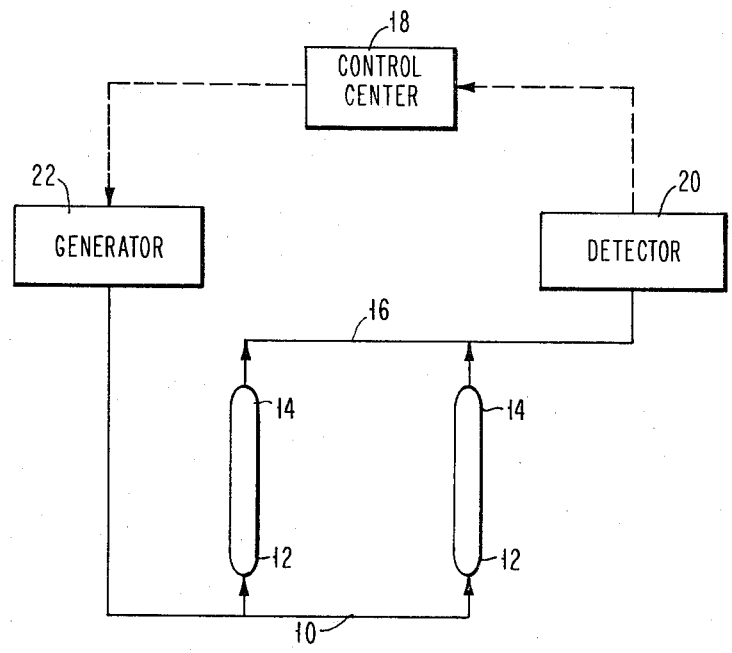
FIG. 1 and FIG. 2 are schematic views of prior art major/minor loop bubble memory system architectures.
Figure 2:
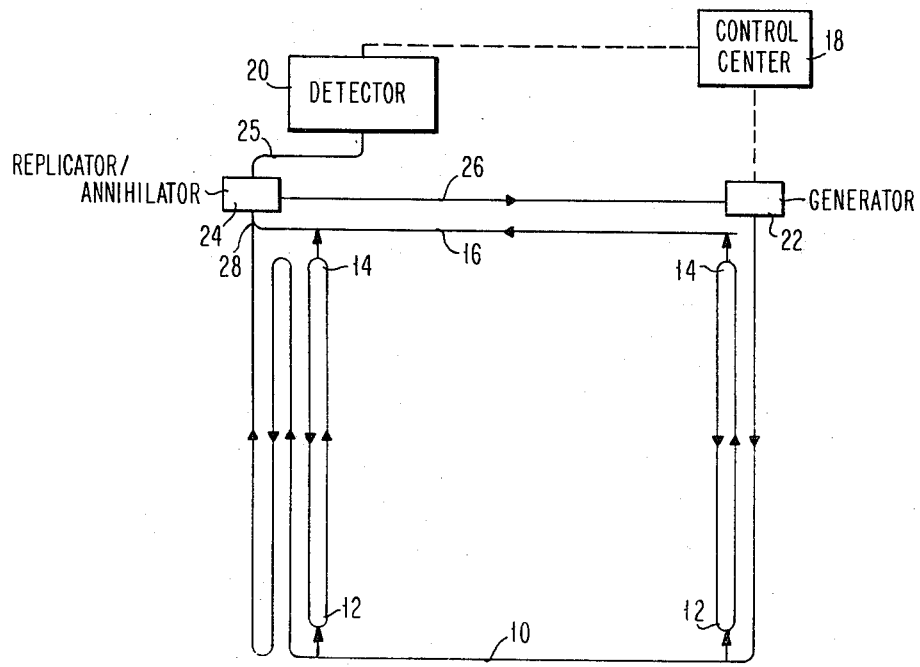
Figure 3:
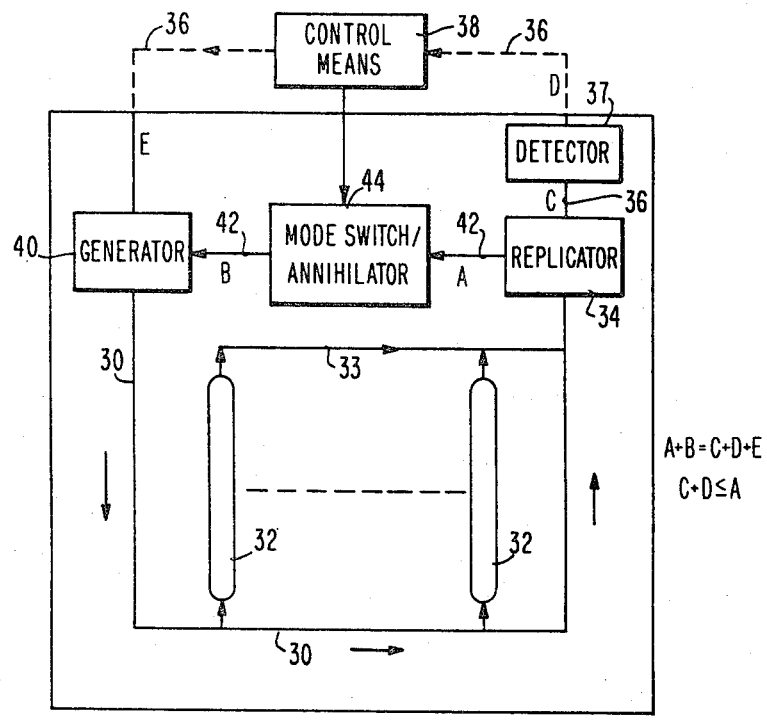
FIG. 3 is a schematic view of one embodiment of the major/minor loop bubble memory system in accordance with this invention.

As shown in FIG. 3, a major/minor loop bubble memory system architecture in accordance with this invention has a write channel 30 positioned on one side of minor loops 32 with read channel 33 positioned on the other side. The bubble domains in read channel 33 go to replicator 34. From replicator 34, there are two paths for bubbles. The first path 36 goes to the detector 37 where the presence or absence of a bubble is detected. The information from the detector 37 is communicated electrically along path 36 off the chip to decision-making means or control center means 38. The information may be altered, replaced or removed in the control center 38. The path 36 then continues to the bubble generator 40 which is on the bubble chip.

The bubbles replicated by bubble replicator 34 proceed along a second path 42 to a mode switch/annihilator 44. The decision-making means 38 is activated to cause the replicated bubbles either to pass through the mode switch-annihilator 44 and continue along path 42 to the generator/merge point 40 and into write channel 30, or the replicated bubbles to be annihilated in the mode switch-annihilator 44 and the bubbles generated by the generator 40 pass into the write channel 30.

The bubble memory architecture shown in FIG. 3 allows the following functions to be performed. (a) Any bit or byte can be positioned within the bubble module to the detector for future reading or writing without the use of an off chip data path and without the loss of data stored on the chip. (b) The reading of a variable length group of bits from the chip before a decision is made to write or leave unchanged the bits that follow or the bits that have already been read is possible with this system. (c) Following a read or a write of a variable length of bits, the propagation of these and any adjacent bits from the read channel and replicate path into the write channel and minor loops without the use of an off chip path is feasible.

Figure 4:
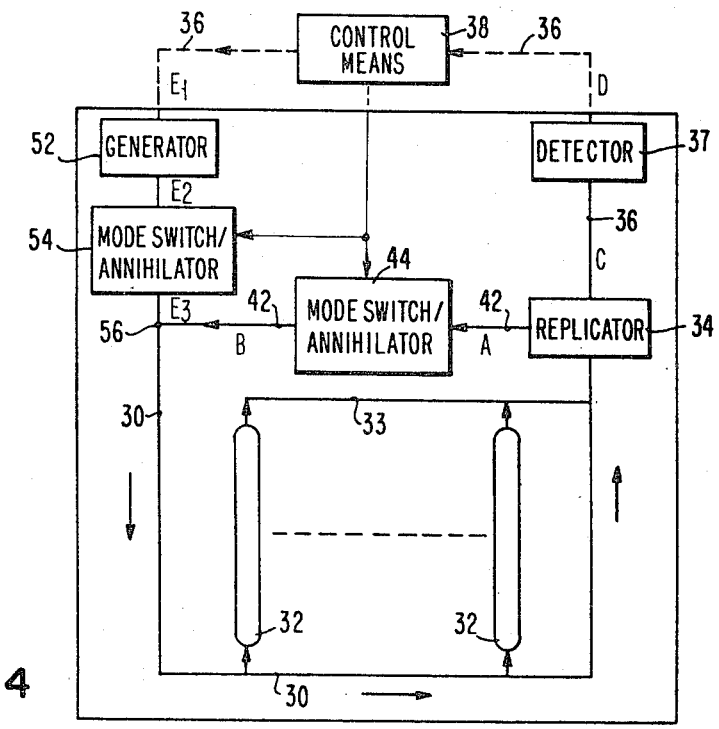
FIG. 4 is a schematic view of a second embodiment of the major/minor loop bubble memory system in accordance with this invention.

Another embodiment is shown in FIG. 4. In this embodiment the generator 52 is positioned at a point other than the merge point 56 in write channel 30. In addition there is a mode switch/annihilator 54 positioned between the generator 52 and the merge point 56 to provide for a proper control of bubbles passing beyond merge point 56. This embodiment is particularly useful in multi-module bubble systems since it provides flexibility and permits multiplexing.

While we have illustrated and described a preferred embodiment of my invention, it is understood that we do not limit ourselves to the precise descriptions herein and the right is reserved to allow changes and modifications coming within the scope of the invention as defined in the appended claims.

We claim:

1. A major/minor loop bubble memory system comprising:
    a bubble chip having a major loop write channel with a merge point positioned therein and a major loop read channel with a detector positioned therein,
    a signal path off said chip from said detector to said merge point,
    a replicator positioned in said read channel, said replicator having first and second output paths with an equal number of propagation steps, said first path going to said merge point, said second path passing via said read channel to said detector and then to said signal path and then to said merge point in said write channel,
    a mode switch-annihilator means positioned in said first path, and
    decision-making means positioned in said signal path, said decision making means spaced from said replicator by up to and including the same number of propagation steps as said mode switch-annihilator means is spaced from said replicator wherein said decision-making means is activated to cause the replicated data to pass through the mode switch-annihilator means into said write channel or to be annihilated in the mode switch-annihilator means.

2. A system as described in claim 1 wherein said decision-making means is spaced from said replicator by the same number of propagation steps as said mode switch-annihilator means is spaced from the replicator.

3. A system as described in claim 1 wherein said decision-making means is spaced from said replicator by a fewer number of propagation steps than said mode switch-annihilator means is spaced from the replicator.

4. A major/minor loop bubble memory system comprising
    a bubble chip having a major loop write channel with a generator and a merge point positioned therein and a major loop read channel with a detector positioned therein,
    a signal path off said chip from said detector to said generator,
    a replicator positioned in said read channel, said replicator having first and second output paths with an equal number of propagation steps, said first path going to said merge point, said second path passing via said read channel to said detector and then to said signal path and then from said generator in said write channel to said merge point,
    a mode switch-annihilator means positioned in said first path, and
    decision-making means positioned in said signal path, said decision making means spaced from said replicator by up to the same number of propagation steps as said mode switch-annihilator means is spaced from said replicator wherein said decision-making means is activated to cause the replicated data to pass through the mode switch-annihilator means into said write channel or to be annihilated in the mode switch-annihilator means so that data from said generator passes into said write channel.

5. A system as described in claim 4 including a second mode switch-annihilator means positioned in said write channel.

6. A major/minor loop bubble memory system having a replicator in the major loop read channel connected to a second path leading to a detector and a decision-making means and a merge point in the major loop write channel, said replicator connected to a first path leading to the merge point on the write channel, the improvement characterized by
    a mode switch-annihilator means positioned in said first path, said decision making means spaced from said replicator by up to the same number of propagation steps as said mode switch-annihilator means is spaced from said replicator wherein said decision making means is activated to cause the replicated data to pass through the mode switch-annihilator means into said write channel or to be annihilated in the mode switch-annihilator means.

* * * * *